United States Patent
Yim et al.

(10) Patent No.: US 11,646,237 B2
(45) Date of Patent: May 9, 2023

(54) METHODS AND APPARATUSES FOR DEPOSITING AMORPHOUS SILICON ATOP METAL OXIDE

(71) Applicant: APPLIED MATERIALS, INC., Santa Clara, CA (US)

(72) Inventors: Dong Kil Yim, Santa Maria, CA (US); Jose-Ignacio Del-Agua Borniquel, Bertem (BE)

(73) Assignee: APPLIED MATERIALS, INC., Santa Clara, CA (US)

(*) Notice: Subject to any disclaimer, the term of this patent is extended or adjusted under 35 U.S.C. 154(b) by 311 days.

(21) Appl. No.: 16/822,755

(22) Filed: Mar. 18, 2020

(65) Prior Publication Data
US 2021/0225710 A1  Jul. 22, 2021

Related U.S. Application Data

(60) Provisional application No. 62/963,053, filed on Jan. 19, 2020.

(51) Int. Cl.
*H01L 21/8254*  (2006.01)
*H01L 29/786*  (2006.01)
(Continued)

(52) U.S. Cl.
CPC .......... *H01L 21/8254* (2013.01); *H01L 29/22* (2013.01); *H01L 29/66742* (2013.01); *H01L 29/78663* (2013.01)

(58) Field of Classification Search
CPC ......... H01L 29/66969; H01L 21/02565; H01L 29/4908; H01L 29/78606; H01L 29/66742; H01L 29/7869; H01L 21/8254; H01L 29/22; H01L 29/78663; H01L 21/0257; H01L 21/02483; H01L 21/02592; H01L 21/02631; H01L 27/1225; H01L 21/02532
See application file for complete search history.

(56) References Cited

U.S. PATENT DOCUMENTS

2012/0045904 A1  2/2012  Choi
2014/0361304 A1  12/2014  Cho et al.
(Continued)

OTHER PUBLICATIONS

Nobuyoshi Saito, et al., High-Mobility and H2-Anneal Tolerant InGaSiO/InGaZnO/InGaSiO Double Hetero Channel Thin Film Transistor for Si-LSI Compatible Process, Journal of the Electron Devices Society, date of publication Feb. 5, 2018; date of current version Apr. 26, 2018, pp. 500-505, vol. 6, 2018.
(Continued)

*Primary Examiner* — Selim U Ahmed
(74) *Attorney, Agent, or Firm* — Moser Taboada

(57) ABSTRACT

In some embodiments, a method of processing a substrate disposed atop a substrate support in a physical vapor deposition process chamber includes: (a) forming a plasma from a process gas within a processing region of the physical vapor deposition chamber, wherein the process gas comprises an inert gas to sputter silicon from a surface of a target within the processing region of the physical vapor deposition chamber; and (b) depositing an amorphous silicon layer atop a first layer on the substrate, wherein the first layer comprises one or more metal oxides of indium (In), gallium (Ga), zinc (Zn), tin (Sn) or combinations thereof.

23 Claims, 5 Drawing Sheets

(51) Int. Cl.
  *H01L 29/66*   (2006.01)
  *H01L 29/22*   (2006.01)

(56) References Cited

U.S. PATENT DOCUMENTS

| | | |
|---|---|---|
| 2015/0171227 A1 | 6/2015 | Ahmed |
| 2016/0246130 A1* | 8/2016 | Li ........................ H01L 21/0217 |
| 2017/0018651 A1 | 1/2017 | Lv |
| 2018/0142343 A1 | 5/2018 | Zeng et al. |
| 2018/0166474 A1 | 6/2018 | Ye et al. |

OTHER PUBLICATIONS

Yoshinobu Asami et al, Properties of c-axis-aligned crystalline ,indium-gallium-zinc oxide field-effect transistors fabricated through a tapered-trench gate process, 2016 Jpn. J. Appl. Phys. 55 04EG09, Japanese Journal of Applied Physics, http://doi.org/10.7567/JJAP.55.04EG09, 7 pages.

International Search Report and Written Opinion for PCT/US2021/013653 dated May 12, 2021.

* cited by examiner

```
┌─────────────────────────────────────┐
│ (A) FORMING A PLASMA FORM A PROCESS │
│ GAS WITHIN A PROCESSING REGION OF THE│
│ PHYSICAL VAPOR DEPOSITION PROCESS   │
│ CHAMBER, WHEREIN THE PROCESS GAS    │─── 202
│ COMPRISES AN INERT GAS TO SPUTTER   │
│ SILICON FROM A SURFACE OF A TARGET  │
│ WITHIN THE PROCESSING REGION OF THE │
│ PHYSICAL VAPOR DEPOSITION CHAMBER   │
└─────────────────────────────────────┘
                  │
                  ▼
┌─────────────────────────────────────┐
│ (B) DEPOSITION AN AMORPHOUS SILICON │
│ LAYER ATOP A FIRST LAYER ON THE     │
│ SUBSTRATE, WHEREIN THE FIRST LAYER  │
│ COMPRISES ONE OR MORE LAYER         │─── 204
│ COMPRISES ONE OR MORE METAL OXIDES OF│
│ INDIUM (IN), GALLIUM (GA), ZINC (ZN), OR│
│ COMBINATIONS THEREOF                │
└─────────────────────────────────────┘
```

FIG. 2

```
┌─────────────────────────────────────┐
│ DEPOSITING AN AMORPHOUS INDIUM      │
│ GALLIUM ZINC OXIDE LAYER ATOP A GATE│─── 302
│ DIELECTRIC LAYER                    │
└─────────────────────────────────────┘
                  │
                  ▼
┌─────────────────────────────────────┐
│ PHYSICAL VAPOR DEPOSITION (PVD)     │
│ DEPOSITING AN AMORPHOUS SILICON LAYER│
│ ATOP THE INDIUM GALLIUM ZINC OXIDE (IGZO)│
│ MATERIAL TO A THICKNESS SUFFICIENT TO│
│ REDUCE OR ELIMINATE HYDROGEN CONTACT│─── 304
│ WITH THE INDIUM GALLIUM ZINC OXIDE (IGZO)│
│ MATERIAL TO REDUCE OR ELIMINATE THE │
│ FORMATION OF OXYGEN VACANCIES       │
└─────────────────────────────────────┘
```

FIG. 3

METHODS AND APPARATUSES FOR DEPOSITING AMORPHOUS SILICON ATOP METAL OXIDE

CROSS-REFERENCE TO RELATED APPLICATIONS

This application claims benefit of U.S. provisional patent application Ser. No. 62/963,053, filed Jan. 19, 2020 which is herein incorporated by reference in its entirety.

FIELD

Embodiments of the present disclosure generally relate to methods and apparatuses for forming a thin film transistor (TFT), and more specifically to methods for forming a TFT having physical vapor deposition (PVD) deposited amorphous silicon atop films of one or more metal oxides of indium (In), gallium (Ga), zinc (Zn), tin (Sn) or combinations thereof.

BACKGROUND

Metal oxide semiconductors, such as indium gallium zinc oxide (IGZO) are attractive for device fabrication due to high carrier mobility, low processing temperatures, and optical transparency. Display and semiconductor chips, Front-End-of-Line (FEOL) or Back-end-of-line (BEOL) transistors include metal oxide semiconductors including indium gallium zinc oxide (IGZO) and may be useful in various applications, such as e.g., display and memory applications. The indium gallium zinc oxide (IGZO) material enables BEOL transistors for memory applications with low or zero leakage and relatively high mobility.

However, metal oxide layers, such as metal oxide channel layers including indium gallium zinc oxide (IGZO) are problematically susceptible to post-deposition processing deficiencies where hydrogen contributes to the formation of oxygen vacancies in the layer making the channel problematically conductive. Oxygen vacancies problematically lead to unstable semiconductor devices and are detrimental to the switching voltage of the devices. In addition, the formation of oxygen vacancies also causes negative threshold voltages, since oxygen vacancies are donors in metal oxide materials.

The inventors have observed that amorphous silicon films deposited via a chemical vapor deposition (CVD) process problematically demonstrate bubbling and peeling and offer little to no protection from hydrogen ($H_2$) leaving films of metal oxides of indium (In), gallium (Ga), zinc (Zn), tin (Sn) or combinations thereof unstable and/or susceptible to problematic interactions with hydrogen such as the formation of oxygen vacancies.

Accordingly, the inventors have provided improved methods for depositing amorphous silicon films via a physical vapor deposition process for improved protection from hydrogen of metal oxide materials such as metal oxides of indium (In), gallium (Ga), zinc (Zn) or tin (Sn) suitable for use as a channel oxide layer

SUMMARY

Embodiments of the present disclosure include methods for processing a substrate. In some embodiments, a method of processing a substrate includes: a method of processing a substrate disposed atop a substrate support in a physical vapor deposition process chamber including: (a) forming a plasma from a process gas within a processing region of the physical vapor deposition process chamber, wherein the process gas comprises an inert gas to sputter silicon from a surface of a target within the processing region of the physical vapor deposition chamber; and (b) depositing an amorphous silicon layer atop a first layer on the substrate, wherein the first layer comprises one or more metal oxides of indium (In), gallium (Ga), zinc (Zn), tin (Sn), or combinations thereof.

In some embodiments, the present disclosure relates to a method of processing a substrate disposed atop a substrate support in a physical vapor deposition chamber, including: (a) depositing a layer of indium gallium zinc oxide (IGZO) material atop a substrate; (b) contacting the layer of indium gallium zinc oxide (IGZO) material with a plasma from a process gas within a processing region of the physical vapor deposition chamber, wherein the process gas comprises an inert gas devoid of hydrogen containing gas to sputter source material from a surface of a target within the processing region of the physical vapor deposition chamber, and (c) physical vapor deposition (PVD) depositing an amorphous silicon layer atop the indium gallium zinc oxide (IGZO) material to a thickness sufficient to reduce or eliminate hydrogen contact with the indium gallium zinc oxide (IGZO) material. In some embodiments, the amorphous silicon is deposited to 25 nanometers, about 15 nanometers, or less than 15 nanometers such as a thickness between 1 to 14 nanometers.

In some embodiments, the present disclosure relates to a method of passivating oxygen vacancy formation within amorphous indium gallium zinc oxide, including: depositing an amorphous indium gallium zinc oxide layer atop a gate dielectric layer; and physical vapor deposition (PVD) depositing an amorphous silicon layer atop the indium gallium zinc oxide (IGZO) material to a thickness sufficient to reduce or eliminate hydrogen contact with the indium gallium zinc oxide (IGZO) material to reduce or eliminate the formation of oxygen vacancies. In some embodiments, the amorphous silicon is deposited to 15 nanometers, about 15 nanometers, or less than 15 nanometers such as a thickness between 1 to 14 nanometers.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

FIG. 2 depicts a flowchart of a method of processing a substrate in accordance with some embodiments of the present disclosure.

FIG. 3 depicts a flowchart of a method of passivating oxygen vacancy formation within amorphous indium gallium zinc oxide.

Figure 1:
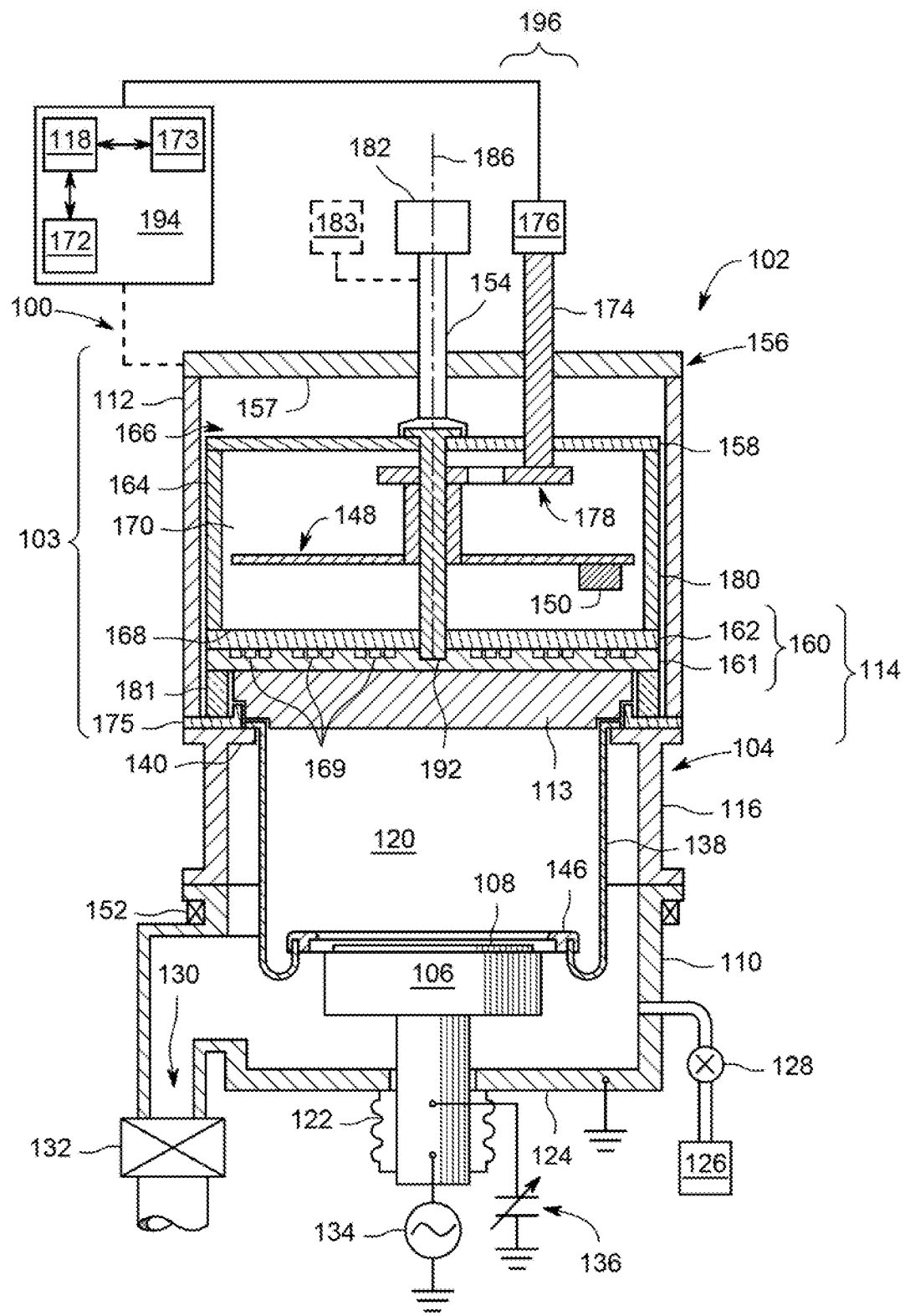
FIG. 1 depicts a schematic cross sectional view of a process chamber used in a method of processing a substrate in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The present disclosure relates to methods of depositing amorphous silicon layers or films via a physical vapor deposition process. In some embodiments, the inventive methods described herein advantageously deposit an amorphous silicon layer without bubbling or peeling of the amorphous silicon layer during subsequent downstream processing. In some embodiments, a method of processing a substrate disposed atop a substrate support in a physical vapor deposition process chamber includes: (a) forming a plasma from a process gas within a processing region of the physical vapor deposition process chamber, wherein the process gas includes an inert gas to sputter silicon from a surface of a target within the processing region of the physical vapor deposition chamber; and (b) depositing an amorphous silicon layer atop a first layer on the substrate, wherein the first layer comprises one or more metal oxides of indium (In), gallium (Ga), zinc (Zn), tin (Sn) or combinations thereof. In embodiments, the amorphous silicon layer reduces or eliminates the formation of oxygen vacancies in a metal oxide channel layer, leading to a more stable TFT and preventing a negative threshold voltage in the TFT. In embodiments, methods of the present disclosure create more robust metal oxide layers, less susceptible to hydrogen reactivity which detrimentally removes oxygen from the metal oxide layers and forms oxygen vacancies, including IGZO with excellent threshold voltage (V) control.

FIG. 1 depicts a simplified, cross-sectional view of an illustrative physical vapor deposition (PVD) processing system 100, in accordance with some embodiments of the present disclosure. FIG. 2 depicts a flow chart of a method 200 for depositing amorphous silicon films atop a substrate disposed in a physical vapor deposition process system of the type described in FIG. 1. FIG. 3 depicts a flow chart of a method 300 for passivating oxygen vacancy formation within amorphous indium gallium zinc oxide by depositing amorphous silicon films atop a substrate disposed in a physical vapor deposition process system of the type described in FIG. 1. The methods 200 and 300 are both further described below with respect to the stages of processing a substrate as depicted in FIGS. 4A-4F. Examples of PVD chambers suitable for performing the methods 200 and 300 described herein include the CIRRUS™, AVENIR®, APPLIED ENDURA IMPULSE™ brand PVD processing chambers, and the NEW ARISTO, AKT-PiVot™, PiVot® KPX brand processing systems commercially available from Applied Materials, Inc., of Santa Clara, Calif.

In embodiments, the physical vapor deposition process chamber (process chamber 104) depicted in FIG. 1 comprises a substrate support 106, a target assembly 114 having an optional backing plate assembly 160 and source material 113 which is disposed on a substrate support facing side of the backing plate assembly 160. The process chamber 104 further includes an RF power source 182 to provide RF energy to the target assembly 114. Additional details relating to the illustrative PVD processing system 100 are discussed below. However, process chamber 104 may be configured with source material 113 configured for depositing one or more metal oxides of indium (In), gallium (Ga), zinc (Zn), tin (Sn) or combinations thereof such as indium gallium zinc oxide (IGZO). In some embodiments, depending upon process needs, process chamber 104 may be configured with source material 113 configured for depositing amorphous silicon as discussed below.

In some embodiments, process chamber 104 is configured for or is suitable for a reactive sputtering process including source material 113, such as one or more metal oxides of indium (In), gallium (Ga), zinc (Zn), or combinations thereof such as indium gallium zinc oxide (IGZO), or Tin (Sn) configured as a sputtering target opposite a substrate in the PVD chamber 100. In embodiments, the source material 113 such as an indium gallium zinc oxide (IGZO) sputtering target may substantially include indium gallium zinc oxide at a ratio of about 1:1:1. In some embodiments, the source material 113 such as an indium gallium zinc oxide (IGZO) sputtering target may include a doping element. Non-limiting examples of suitable dopants include aluminum (Al), tin (Sn), titanium (Ti), copper (Cu), or magnesium (Mg), or combinations thereof. In one embodiment, the dopant includes aluminum. In some embodiments, the process chamber 104 contains a substrate support 106 for receiving a substrate (not shown in FIG. 1). In embodiments, a substrate such as substrate 402 (FIG. 4A) may be disposed atop substrate support 106. In embodiments, substrate 402 may include plastic, paper, polymer, glass, stainless steel, and combinations thereof. In some embodiments, wherein the substrate 402 is plastic, the reactive sputtering may occur at temperatures below about 25 to 300 degrees Celsius, such as 300 degrees Celsius or about 300 degrees Celsius.

In some embodiments, during a sputtering process where source material 113 includes indium gallium zinc oxide (IGZO) material configured as a sputtering target, argon may be provided to the chamber for reactive sputtering the target, such as an indium gallium zinc oxide (IGZO) target. Additional additives such as $B_2H_6$, $CO_2$, CO, $CH_4$, and combinations thereof may also be provided to the chamber during the sputtering. In one embodiment, a nitrogen containing gas may be included including nitrogen ($N_2$). In another embodiment, a nitrogen containing gas may include $N_2O$, or combinations thereof. In one embodiment, the oxygen may be included such as $O_2$. In another embodiment, an oxygen containing gas comprises $N_2O$. The nitrogen of the nitrogen containing gas and the oxygen of the oxygen containing gas react with the atoms from the sputtering target to form a metal oxide layer including zinc, oxygen, and nitrogen on the substrate. In one embodiment, the metal oxide layer is an amorphous indium gallium zinc oxide (IGZO) layer. In some embodiments, the metal oxide layer is an amorphous indium gallium zinc oxide (IGZO) layer with preselected electrical properties and suitable for use in an integrated device.

In some embodiments, during a sputtering process where source material 113 includes indium gallium zinc oxide (IGZO) material configured as a sputtering target, sputtering is performed for a duration and under conditions sufficient to form an indium gallium zinc oxide layer or an amorphous indium gallium zinc oxide layer having a thickness of between about 5 to about 100 nanometers, 5 to 75 nanometers, or 10 to about 30 nanometers. In some embodiments, an amorphous indium gallium zinc oxide layer is formed having a top surface and a bottom surface, a depth between the top surface and the bottom surface including a thickness of between about 10 to about 30 nanometers. In some embodiments, the amorphous indium gallium zinc oxide layer is formed atop a substrate such as a substrate including a gate dielectric layer at a temperature of 25 degrees Celsius to 350 degrees Celsius under sputter gas comprising or consisting of argon. In embodiments, about 15 to 30 nanometers of amorphous indium gallium zinc oxide (IGZO) is deposited at about 300 degrees Celsius in up to 100% argon environment in the deposition chamber. In embodiments, argon is suitable as a sputtering gas and provided in amounts sufficient to promote the formation of amorphous indium gallium zinc oxide (IGZO).

As mentioned above, in some embodiments, process chamber 104 is configured for or is suitable for a reactive sputtering process including source material 113 such as silicon configured as a sputtering target opposite a substrate in the PVD chamber 100. In some embodiments, process chamber 104 is configured for depositing amorphous silicon in an amount sufficient to cover an indium gallium zinc oxide (IGZO) layer under conditions sufficient to reduce or eliminate residual hydrogen from reacting with oxygen within the indium gallium zinc oxide (IGZO) layer material, and/or reduce or eliminate the formation of oxygen vacancies. In embodiments, a substantial amount of oxygen vacancies are reduced or eliminated such as up to 95%, 96%, 97%, 98%, 99% or 95% to 99.99% such as when compared to similar indium gallium zinc oxide layer material that has not been covered or capped with PVD deposited amorphous silicon in accordance with the present disclosure. In some embodiments, zero oxygen vacancies are formed after capping with PVD deposited amorphous silicon in accordance with the present disclosure. In some embodiments, the amorphous silicon is deposited to a thickness of 15 nanometers, about 15 nanometers, or less than 15 nanometers such as a thickness between 1 to 14 nanometers.

In some embodiment, the amorphous silicon capping process is performed on a portion less than the entire top surface of the indium gallium zinc oxide (IGZO) layer. For example, it is possible to cover only a portion of the indium gallium zinc oxide (IGZO) layer immediately below or adjacent a gate material layer. Further, it is possible to leave one or more uncovered portions of the indium gallium zinc oxide (IGZO) layer, wherein the one or more uncovered portions are capped or covered with another material such as a metal disposed within a metal line or via. In embodiments, the process may be repeated as many times as needed until a desired depth of amorphous silicon is deposited atop the entire length of the indium gallium zinc oxide (IGZO) layer. In embodiments, the process may be repeated as many times as needed until a preselected depth of amorphous silicon is deposited atop the entire length of the indium gallium zinc oxide (IGZO) layer to a predetermine thickness, such as wherein the predetermined thickness is sufficient to cap the indium gallium zinc oxide (IGZO) layer and reduce or eliminate contact with hydrogen ($H_2$).

In some embodiment, subsequent to the amorphous silicon capping process, a capped indium gallium zinc oxide layer is subjected to additional downstream processing. For example, suitable post-capping thermal treatment techniques may include UV treatment, thermal annealing, and laser annealing.

Referring now to FIG. 2, a method 200 of processing a substrate disposed atop a substrate support in a physical vapor deposition process chamber includes: at process sequence 202 (a) forming a plasma from a process gas within a processing region of the physical vapor deposition process chamber, wherein the process gas includes an inert gas to sputter silicon from a surface of a target within the processing region of the physical vapor deposition chamber. At process sequence 204 method 200 includes (b) depositing an amorphous silicon layer atop a first layer on the substrate, wherein the first layer includes one or more metal oxides of indium (In), gallium (Ga), zinc (Zn), tin (Sn) or combinations thereof. In some embodiments, the one or more metal oxides comprises indium gallium zinc oxide (IGZO) material. In some embodiments, the inert gas includes argon, neon, krypton, xenon or combinations thereof. In some embodiments, the process gas is devoid of hydrogen containing gas, and may optionally consist essentially of the inert gas. In some embodiments, the inert gas is provided at a flow rate of about 50 to about 1000 sccm. In some embodiments, the process gas is devoid of hydrogen ($H_2$) gas, ammonia ($NH_3$), or an alkane having a formula $C_nH_{2n+2}$. In some embodiments, the processing region of the physical vapor deposition chamber during deposition of the amorphous silicon layer is about 3 to about 10 millitorr. In some embodiments, a temperature in the processing region of the physical vapor deposition chamber during deposition of the amorphous silicon layer is about 25 to about 400 degrees Celsius. In some embodiments, forming a plasma from a process gas further comprises applying a source power from a power source to the physical vapor deposition chamber to ignite the process gas. In some embodiments, the power source provides pulsed DC power at a pulse frequency of about 100 to about 250 kHz and at a duty cycle of about 10% to about 40%.

Referring now to FIG. 3, a method 300 of passivating oxygen vacancy formation within amorphous indium gallium zinc oxide, includes: 302 depositing an amorphous indium gallium zinc oxide (IGZO) layer atop a gate dielectric layer; and 304 physical vapor deposition (PVD) depositing an amorphous silicon layer atop the indium gallium zinc oxide (IGZO) material to a thickness sufficient to reduce or eliminate hydrogen contact with the indium gallium zinc oxide (IGZO) material to reduce or eliminate the formation of oxygen vacancies.

Referring now to FIGS. 4A-4F, cross sectional schematic views of a TFT 400 are shown at various stages of fabrication according to embodiments of the present disclosure such as method 200 and method 300 described above. In embodiments, the TFT 400 may be a top gate TFT and may include a substrate 402. In one embodiment, the substrate 402 may be glass, polymer, plastic, metal or combinations thereof. In still another embodiment, the substrate 402 may be a stainless steel sheet. In some embodiments, a thermal oxide layer 404 may be formed on the substrate 402, and the thermal oxide layer 404 may be in direct contact with the substrate 402. In some embodiments, a silicon oxide layer 406 may be formed on the thermal oxide layer 404, and the silicon oxide layer 406 may be in direct contact with the thermal oxide layer 404. In some embodiments, an indium gallium zinc oxide (IGZO) layer 408 may be deposited over the substrate 402, such as on and in direct contact with the silicon oxide layer 406. In some embodiments, the indium gallium zinc oxide (IGZO) layer 408 may be amorphous and/or include an active channel in the final TFT structure. In one embodiment, the amorphous indium gallium zinc oxide (IGZO) layer 408 may be deposited by sputtering using the PVD chamber 100 shown in FIG. 1 under the conditions described above.

In some embodiments, after the indium gallium zinc oxide (IGZO) layer 408 is deposited, an amorphous silicon capping process may be performed on the indium gallium zinc oxide (IGZO) layer 408 to deposit amorphous silicon layer 409 to a preselected thickness. In embodiments, the capping process or deposition of amorphous silicon layer 409 directly atop the indium gallium zinc oxide (IGZO) layer 408 may be performed in PVD chamber 1 shown above under the conditions described above.

In some embodiments, after an indium gallium zinc oxide (IGZO) layer 408 characterized as amorphous is deposited, in order to prevent oxygen from leaving the amorphous indium gallium zinc oxide layer, the amorphous indium gallium zinc oxide layer may be capped with amorphous silicon layer 409. In embodiments, the amorphous silicon layer 409 is deposited by a plasma treatment to form amorphous silicon layer 409 directly atop an amorphous indium gallium zinc oxide layer such as by exposing the amorphous indium gallium zinc oxide (IGZO) layer to an amorphous silicon PVD deposition as described herein.

Figure 4A:
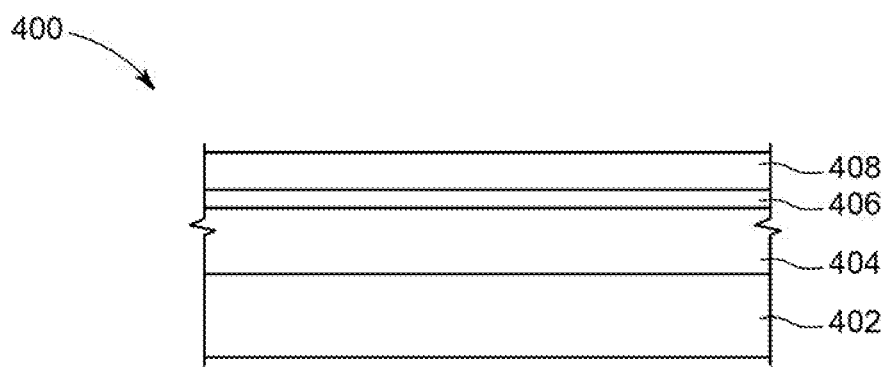
FIGS. 4A-4F depict the stages of processing a substrate in accordance with some embodiments of the present disclosure.
Figure 4B:
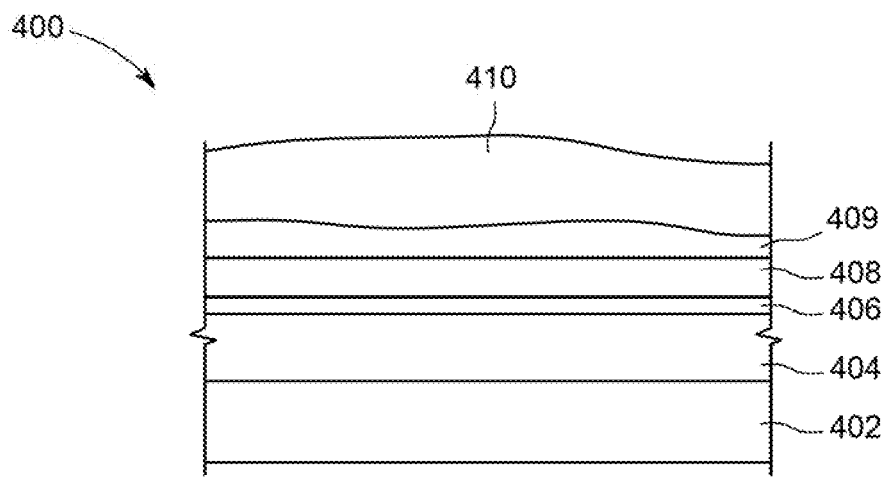
Figure 4C:
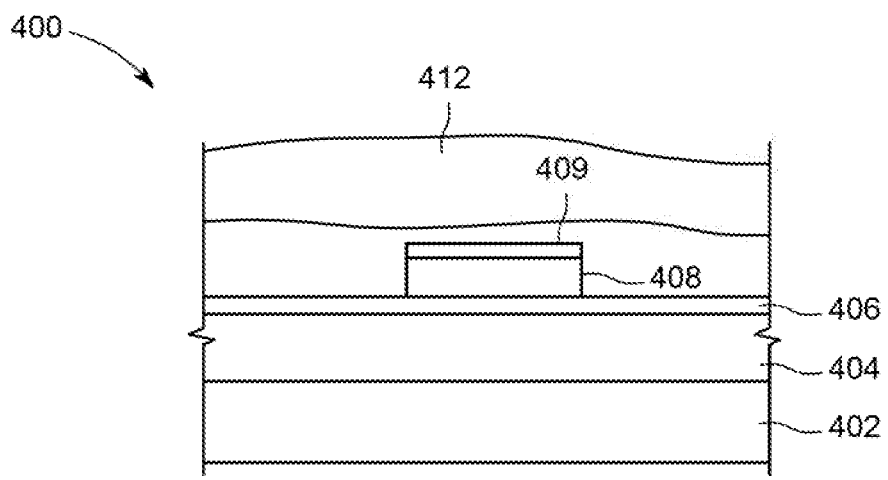

In some embodiments, as show in FIG. 4C, the amorphous silicon layer 409 and indium gallium zinc oxide (IGZO) layer 408 may be patterned, such as by etching to remove portions of the amorphous silicon layer 409 and indium gallium zinc oxide (IGZO) layer 408, to expose portions of the silicon oxide layer 406. Following the etching of the portions of the amorphous silicon layer 409 and indium gallium zinc oxide (IGZO) layer 408, the amorphous silicon layer 409 and indium gallium zinc oxide (IGZO) layer 408 may be treated again by adding addition amorphous silicon atop indium gallium zinc oxide (IGZO) layer 408.

Figure 4D:
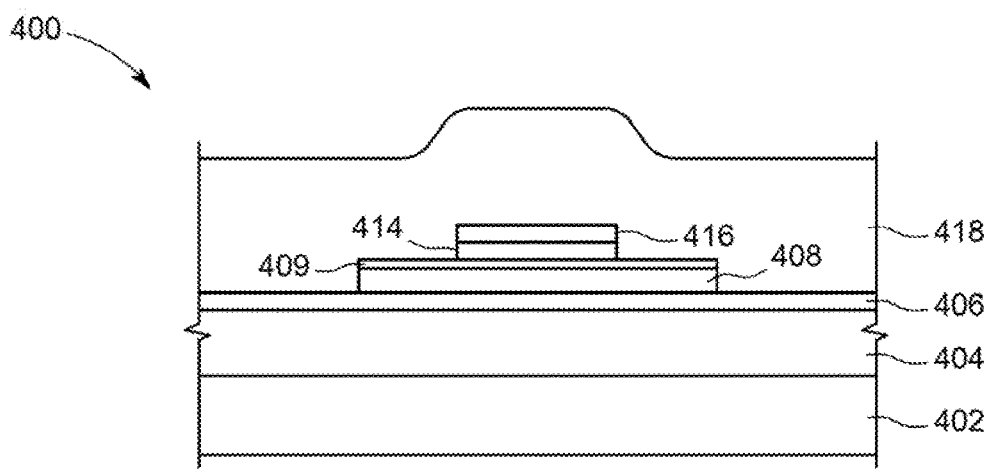

In some embodiments, as shown in FIG. 4D, a gate dielectric layer 414 may be deposited on the amorphous silicon layer 409. The gate dielectric layer 414 may be a deposited by well-known deposition techniques including PECVD. In one embodiment, the gate dielectric layer 414 may be deposited by PVD and may comprise silicon dioxide (SiO$_2$). In embodiments, a gate contact layer 416 may be deposited on the gate dielectric layer 414, and the gate contact layer 416 may be made of a metal such as aluminum, molybdenum, tungsten, chromium, tantalum, or combinations thereof. The gate contact layer 416 may be formed using conventional deposition techniques including sputtering, lithography, and etching. The gate contact layer 416 may be formed by blanket depositing a conductive layer over the substrate. The gate dielectric layer 414 and the gate contact layer 416 may be patterned, such as by etching to remove portions of the gate dielectric layer 414 and the gate contact layer 416, to expose portions of the amorphous silicon capped indium gallium zinc oxide layer. In some embodiments, an inter-layer dielectric (ILD) layer 418 may be deposited on the exposed silicon oxide layer 406, the exposed indium gallium zinc oxide (IGZO) layer 408, and the gate contact layer 416. The ILD layer 418 may be made of any suitable dielectric material, such as silicon oxide.

Figure 4E:
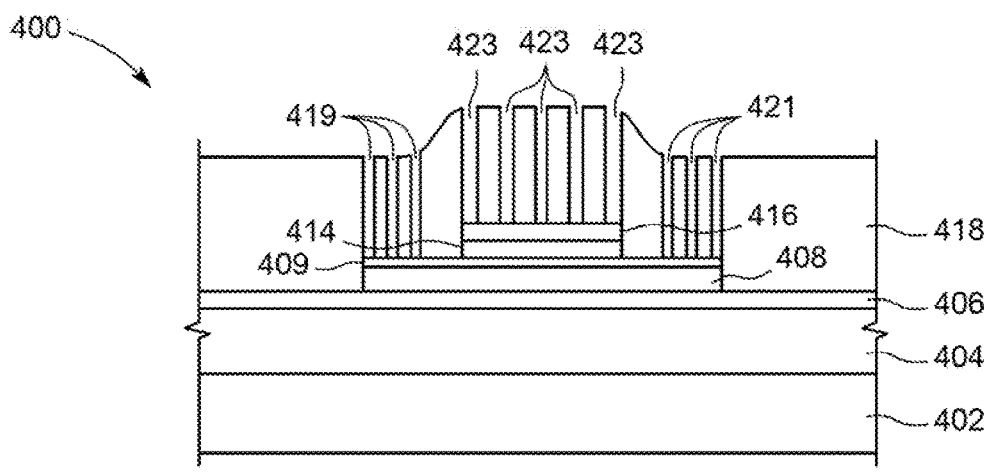
Figure 4F:
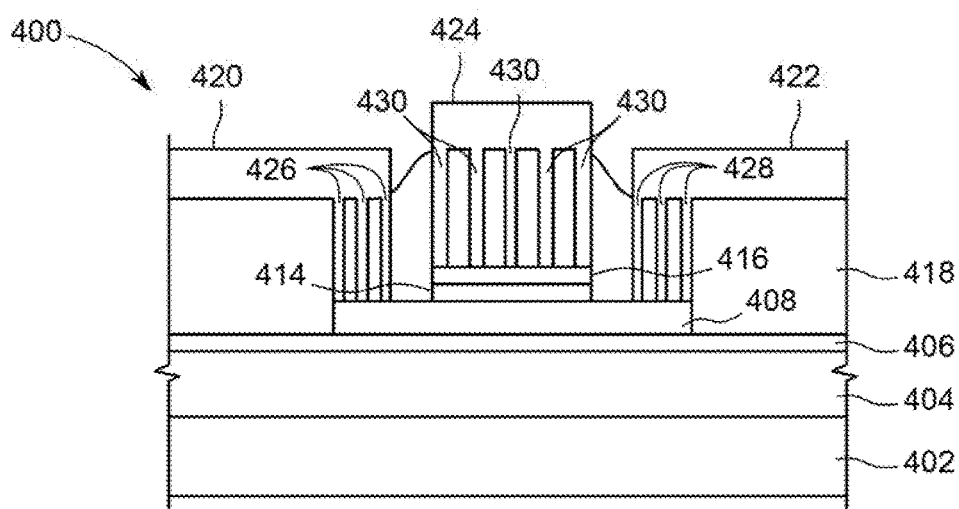

In some embodiments, a plurality of contact holes 419, 421, 423 may be formed in the ILD layer 418, as shown in FIG. 4E. The contact holes 419, 421, 423 may be formed by any suitable method, such as etching. Portions of the amorphous silicon layer 409 atop the indium gallium zinc oxide (IGZO) layer 408 may be exposed due to the forming of the plurality of contact holes 419, 421, and portions of the gate contact layer 416 may be exposed due to the forming of the plurality of contact holes 423. The contact holes 419, 421, 423 may be filled with a metal to form contacts 426, 428, 430, respectively, as shown in FIG. 4E. The plurality of contacts 426, 428, 430 may be made of the same material as the gate electrode 304. The plurality of contacts 426, 428 may be in direct contact with the amorphous silicon layer 409, and the plurality of contacts 430 may be in direct contact with the gate contact layer 416. Referring to FIG. 4F, a metal layer may be deposited on the ILD layer 418, and the metal layer may be patterned to define a source electrode 420, a drain electrode 422, and a gate electrode 424. The source electrode 420, the drain electrode 422, and the gate electrode 424 may be made of the same material as the gate electrode 304. The source electrode 420 may be in direct contact with the plurality of contacts 426, the drain electrode 422 may be in direct contact with the plurality of contacts 428, and the gate electrode 424 may be in direct contact with the plurality of contacts 430. Since the gate electrode 424 is formed over the indium gallium zinc oxide (IGZO) layer 408, the TFT 400 may be a top gate TFT.

Returning to FIG. 1, a second energy source 183, optionally coupled to the target assembly 114, may provide DC power to the target assembly 114 to direct the plasma towards the target assembly 114. In some embodiments, the DC power may range from about 200 W to about 20 kilowatts (kW), although the amount of DC power applied may vary depending upon chamber geometry (e.g., target size or the like). In some embodiments, the DC power may also be adjusted over the life of the target in the same manner as described above for the RF power. The DC power may be adjusted to control the deposition rate of sputtered metal atoms on the substrate. For example, increasing the DC power can result in increased interaction of the plasma with the source material 113 and increased sputtering of metal atoms from the target assembly 114.

The PVD processing system 100 includes a chamber lid 102 removably disposed atop a process chamber 104. The chamber lid 102 may include the target assembly 114 and a grounding assembly 103. The process chamber 104 contains a substrate support 106 for receiving a substrate 108. The substrate support 106 may be located within a lower grounded enclosure wall 110, which may be a chamber wall of the process chamber 104. The lower grounded enclosure wall 110 may be electrically coupled to the grounding assembly 103 of the chamber lid 102 such that an RF return path is provided to an RF power source 182 disposed above the chamber lid 102. The RF power source 182 may provide RF energy to the target assembly 114 as discussed below. Alternatively, or in combination a DC power source may be similarly coupled to target assembly 114.

The PVD processing system 100 may include a source distribution plate 158 opposing a backside of the target assembly 114 and electrically coupled to the target assembly 114 along a peripheral edge of the target assembly 114. The PVD processing system 100 may include a cavity 170 disposed between the backside of the target assembly 114 and the source distribution plate 158. The cavity 170 may at least partially house a magnetron assembly 196 as discussed below. The cavity 170 is at least partially defined by the inner surface of a conductive support ring 164, a target facing surface of the source distribution plate 158, and a source distribution plate facing surface (e.g., backside) of the target assembly 114 (or backing plate assembly 160).

The PVD processing system 100 further includes a magnetron assembly. The magnetron assembly provides a rotating magnetic field proximate the target assembly 114 to assist in plasma processing within the process chamber 104. The magnetron assembly includes a rotatable magnet assembly 148 disposed within the cavity 170. The rotatable magnet assembly 148 rotates about a central axis 186 of the process chamber 104.

In some embodiments, the magnetron assembly includes a motor 176, a motor shaft 174, a gear assembly 178, and the rotatable magnet assembly 148. The rotatable magnet assembly 148 includes a plurality of magnets 150 and is configured to rotate the plurality of magnets 150 about the central axis 186 as described below. The motor 176 may be an electric motor, a pneumatic or hydraulic drive, or any other process-compatible mechanism that can provide suitable torque. While one illustrative embodiment is described herein to illustrate how the rotatable magnet assembly 148 may be rotated, other configurations may also be used.

In use, the magnetron assembly rotates the rotatable magnet assembly 148 within the cavity 170. For example, in some embodiments, the motor 176, motor shaft 174, and gear assembly 178 may be provided to rotate the rotatable magnet assembly 148. In some embodiments, the electrode 154 is aligned with the central axis 186 of the process chamber 104, and motor shaft 174 of the magnetron may be disposed through an off-center opening in the ground plate 156. The end of the motor shaft 174 protruding from the ground plate 156 is coupled to the motor 176. The motor shaft 174 is further disposed through an off-center opening in the source distribution plate 158 and coupled to a gear assembly 178.

The gear assembly 178 may be supported by any suitable means, such as by being coupled to a bottom surface of the source distribution plate 158. The gear assembly 178 may be insulated from the source distribution plate 158 by fabricating at least the upper surface of the gear assembly 178 from a dielectric material, or by interposing an insulator layer (not shown) between the gear assembly 178 and the source distribution plate 158, or the like, or by constructing the motor shaft 174 out of suitable dielectric material. The gear assembly 178 is further coupled to the rotatable magnet assembly 148 to transfer the rotational motion provided by the motor 176 to the rotatable magnet assembly 148. The gear assembly 178 may be coupled to the rotatable magnet assembly 148 through the use of pulleys, gears, or other suitable means of transferring the rotational motion provided by the motor 176.

The substrate support 106 has a material-receiving surface facing a principal surface of a target assembly 114 and supports the substrate 108 to be sputter coated in planar position opposite to the principal surface of the target assembly 114. The substrate support 106 may support the substrate 108 in a processing region 120 of the process chamber 104. The processing region 120 is defined as the region above the substrate support 106 during processing (for example, between the target assembly 114 and the substrate support 106 when in a processing position).

In some embodiments, the substrate support 106 may be vertically movable to allow the substrate 108 to be transferred onto the substrate support 106 through a load lock valve (not shown) in the lower portion of the process chamber 104 and thereafter raised to a deposition, or processing position. A bellows 122 connected to a bottom chamber wall 124 may be provided to maintain a separation of the inner volume of the process chamber 104 from the atmosphere outside of the process chamber 104 while facilitating vertical movement of the substrate support 106. One or more gases may be supplied from a gas source 126 through a mass flow controller 128 into the lower part of the process chamber 104.

The gas source 126 may be a gas box providing the gases used in the methods described above via one or more gas lines coupled to the process chamber 104. For example, a first gas line may be provided from the gas source 126 to the process chamber 104 to provide a preselected process gas to the process chamber 104. A second gas line may be provided from the gas source 126 to the process chamber 104 to provide one or more of oxygen ($O_2$), nitrogen ($N_2$), carbon monoxide (CO) or argon (Ar) to the process chamber 104. A third gas line may be provided from the gas source 126 to the process chamber 104 to provide a backside gas (such as a mixture of argon or other suitable backside gas) to the substrate support 106. It should be understood that hydrogen gas is problematic with respect to forming oxygen vacancies in the IGZO layer, and hydrogen should, in embodiments be avoided or not used.

An exhaust port 130 may be provided and coupled to a pump (not shown) via a valve 132 for exhausting the interior of the process chamber 104 and to facilitate maintaining a suitable pressure inside the process chamber 104. In embodiments, the system remains under vacuum to ensure elimination of hydrogen gas.

The process chamber 104 further includes a process kit shield, or shield, 138 to surround the processing volume, or central region, of the process chamber 104 and to protect other chamber components from damage and/or contamination from processing. In some embodiments, the shield 138 may be connected to a ledge 140 of an upper grounded enclosure wall 116 of the process chamber 104. As illustrated in FIG. 1, the chamber lid 102 may rest on the ledge 140 of the upper grounded enclosure wall 116. Similar to the lower grounded enclosure wall 110, the upper grounded enclosure wall 116 may provide a portion of the RF return path between the lower grounded enclosure wall 116 and the grounding assembly 103 of the chamber lid 102. However, other RF return paths are possible, such as via the grounded shield 138.

The shield 138 extends downwardly and may include a generally tubular portion having a generally constant diameter that generally surrounds the processing region 120. The shield 138 extends along the walls of the upper grounded enclosure wall 116 and the lower grounded enclosure wall 110 downwardly to below a top surface of the substrate support 106 and returns upwardly until reaching a top surface of the substrate support 106 (e.g., forming a u-shaped portion at the bottom of the shield 138). A cover ring 146 rests on the top of an upwardly extending inner portion of the shield 138 when the substrate support 106 is in the lower, loading position but rests on the outer periphery of the substrate support 106 when the substrate support is in the upper, deposition position to protect the substrate support 106 from sputter deposition. An additional deposition ring (not shown) may be used to protect the edges of the substrate support 106 from deposition around the edge of the substrate 108.

In some embodiments, a magnet 152 may be disposed about the process chamber 104 for selectively providing a magnetic field between the substrate support 106 and the target assembly 114. For example, as shown in FIG. 1, the magnet 152 may be disposed about the outside of the enclosure wall 110 in a region just above the substrate support 106 when in processing position. In some embodiments, the magnet 152 may be disposed additionally or alternatively in other locations, such as adjacent the upper grounded enclosure wall 116. The magnet 152 may be an electromagnet and may be coupled to a power source (not shown) for controlling the magnitude of the magnetic field generated by the electromagnet.

The chamber lid 102 generally includes the grounding assembly 103 disposed about the target assembly 114. The grounding assembly 103 may include a grounding plate 156 having a first surface 157 that may be generally parallel to and opposite a backside of the target assembly 114. A grounding shield 112 may extending from the first surface 157 of the grounding plate 156 and surround the target assembly 114. The grounding assembly 103 may include a support member 175 to support the target assembly 114 within the grounding assembly 103.

In some embodiments, the support member 175 may be coupled to a lower end of the grounding shield 112 proximate an outer peripheral edge of the support member 175 and extends radially inward to support a seal ring 181, and the target assembly 114. The seal ring 181 may be a ring or other annular shape having a suitable cross-section. The seal ring 181 may include two opposing planar and generally parallel surfaces to facilitate interfacing with the target assembly 114, such as the backing plate assembly 160, on a first side of the seal ring 181 and with the support member 175 on a second side of the seal ring 181. The seal ring 181 may be made of a dielectric material, such as ceramic. The seal ring 181 may insulate the target assembly 114 from the ground assembly 103.

The support member 175 may be a generally planar member having a central opening to accommodate the target assembly 114. In some embodiments, the support member 175 may be circular, or disc-like in shape, although the shape may vary depending upon the corresponding shape of the chamber lid and/or the shape of the substrate to be processed in the PVD processing system 100.

The target assembly 114 may comprise a source material 113, as described above such as amorphous silicon or indium gallium zinc oxide (IGZO) material depending upon process needs, to be deposited on a substrate, such as the substrate 108 during sputtering. In some embodiments, the target assembly 114 may be fabricated substantially from the source material 113, without any backing plate to support the source material 113. In some embodiments, the target assembly 114 includes a backing plate assembly 160 to support the source material 113. The source material 113 may be disposed on a substrate support facing side of the backing plate assembly 160 as illustrated in FIG. 1. The backing plate assembly 160 may comprise a conductive material, such as copper-zinc, copper-chrome, or the same material as the target, such that RF and DC power can be coupled to the source material 113 via the backing plate assembly 160. Alternatively, the backing plate assembly 160 may be non-conductive and may include conductive elements (not shown) such as electrical feedthroughs or the like.

In some embodiments, the backing plate assembly 160 includes a first backing plate 161 and a second backing plate 162. The first backing plate 161 and the second backing plate 162 may be disc shaped, rectangular, square, or any other shape that may be accommodated by the PVD processing system 100. A front side of the first backing plate 161 is configured to support the source material 113 such that a front surface of the source material opposes the substrate 108 when present. The source material 113 may be coupled to the first backing plate 161 in any suitable manner. For example, in some embodiments, the source material 113 may be diffusion bonded to the first backing plate 161.

A plurality of sets of channels 169 may be disposed between the first and second backing plates 161, 162. The first and second backing plates 161, 162 may be coupled together to form a substantially water tight seal (e.g., a fluid seal between the first and second backing plates) to prevent leakage of coolant provided to the plurality of sets of channels 169. In some embodiments, the target assembly 114 may further comprise a central support member 192 to support the target assembly 114 within the process chamber 104.

In some embodiments, the conductive support ring 164 may be disposed between the source distribution plate 158 and the backside of the target assembly 114 to propagate RF energy from the source distribution plate to the peripheral edge of the target assembly 114. The conductive support ring 164 may be cylindrical, with a first end 166 coupled to a target-facing surface of the source distribution plate 158 proximate the peripheral edge of the source distribution plate 158 and a second end 168 coupled to a source distribution plate-facing surface of the target assembly 114 proximate the peripheral edge of the target assembly 114. In some embodiments, the second end 168 is coupled to a source distribution plate facing surface of the backing plate assembly 160 proximate the peripheral edge of the backing plate assembly 160.

An insulative gap 180 is provided between the grounding plate 156 and the outer surfaces of the source distribution plate 158, the conductive support ring 164, and the target assembly 114 (and/or backing plate assembly 160). The insulative gap 180 may be filled with air or some other suitable dielectric material, such as a ceramic, a plastic, or the like. The distance between the grounding plate 156 and the source distribution plate 158 depends on the dielectric material between the grounding plate 156 and the source distribution plate 158. Where the dielectric material is predominantly air, the distance between the grounding plate 156 and the source distribution plate 158 may be between about 15 mm and about 40 mm.

The grounding assembly 103 and the target assembly 114 may be electrically separated by the seal ring 181 and by one or more of insulators (not shown) disposed between the first surface 157 of the grounding plate 156 and the backside of the target assembly 114, e.g., a non-target facing side of the source distribution plate 158.

The PVD processing system 100 has an RF power source 182 connected to an electrode 154 (e.g., a RF feed structure). The electrode 154 may pass through the grounding plate 156 and is coupled to the source distribution plate 158. The RF power source 182 may include an RF generator and a matching circuit, for example, to minimize reflected RF energy reflected back to the RF generator during operation. For example, RF energy supplied by the RF power source 182 may range in frequency from about 13.56 MHz to about 162 MHz or above. For example, non-limiting frequencies such as 13.56 MHz, 27.12 MHz, 40.68 MHz, 60 MHz, or 162 MHz can be used.

In some embodiments, PVD processing system 100 may include a second energy source 183 to provide additional energy to the target assembly 114 during processing. In some embodiments, the second energy source 183 may be a DC power source or a pulsed DC power source to provide DC energy, for example, to enhance a sputtering rate of the target material (and hence, a deposition rate on the substrate). In some embodiments, the second energy source 183 may be a second RF power source, similar to the RF power source 182, to provide RF energy, for example, at a second frequency different than a first frequency of RF energy provided by the RF power source 182. In embodiments where the second energy source 183 is a DC power source, the second energy source may be coupled to the target assembly 114 in any location suitable to electrically couple the DC energy to the target assembly 114, such as the electrode 154 or some other conductive member (such as the source distribution plate 158, discussed below). In embodiments where the second energy source 183 is a second RF power source, the second energy source may be coupled to the target assembly 114 via the electrode 154.

The electrode 154 may be cylindrical or otherwise rod-like and may be aligned with a central axis 186 of the process chamber 104 (e.g., the electrode 154 may be coupled to the target assembly at a point coincident with a central axis of the target, which is coincident with the central axis 186). The electrode 154, aligned with the central axis 186 of the process chamber 104, facilitates applying RF energy from the RF power source 182 to the target assembly 114 in an axisymmetrical manner (e.g., the electrode 154 may couple RF energy to the target at a "single point" aligned with the central axis of the PVD chamber). The central position of the electrode 154 helps to eliminate or reduce deposition asymmetry in substrate deposition processes. The electrode 154 may have any suitable diameter. For example, although other diameters may be used, in some embodiments, the diameter of the electrode 154 may be about 0.5 to about 2 inches. The electrode 154 may generally have any suitable length depending upon the configuration of the PVD chamber. In some embodiments, the electrode may have a length of between about 0.5 to about 12 inches. The electrode 154 may be fabricated from any suitable conductive material, such as aluminum, copper, silver, or the like. Alternatively, in some embodiments, the electrode 154 may be tubular. In some embodiments, the diameter of the tubular electrode 154 may be suitable, for example, to facilitate providing a central shaft for the magnetron.

The electrode 154 may pass through the ground plate 156 and is coupled to the source distribution plate 158. The ground plate 156 may comprise any suitable conductive material, such as aluminum, copper, or the like. The open spaces between the one or more insulators (not shown) allow for RF wave propagation along the surface of the source distribution plate 158. In some embodiments, the one or more insulators may be symmetrically positioned with respect to the central axis 186 of the PVD processing system. Such positioning may facilitate symmetric RF wave propagation along the surface of the source distribution plate 158 and, ultimately, to a target assembly 114 coupled to the source distribution plate 158. The RF energy may be provided in a more symmetric and uniform manner as compared to conventional PVD chambers due, at least in part, to the central position of the electrode 154.

The PVD processing system 100 further comprises a substrate support impedance circuit, such as auto capacitance tuner 136, coupled to the substrate support 106 for adjusting voltage on the substrate 108. For example, the auto capacitance tuner 136 may be used to control the voltage on the substrate 108, and thus, the substrate current (e.g., ion energy at the substrate level).

A controller 194 may be provided and coupled to various components of the PVD processing system 100 to control the operation thereof. The controller 194 includes a central processing unit (CPU) 118, a memory 172, and support circuits 173. The controller 194 may control the PVD processing system 100 directly, or via computers (or controllers) associated with particular process chamber and/or support system components. The controller 194 may be one of any form of general-purpose computer processor that can be used in an industrial setting for controlling various chambers and sub-processors. The memory, or computer readable medium, 172 of the controller 194 may be one or more of readily available memory such as random access memory (RAM), read only memory (ROM), floppy disk, hard disk, optical storage media (e.g., compact disc or digital video disc), flash drive, or any other form of digital storage, local or remote. The support circuits 173 are coupled to the CPU 118 for supporting the processor in a conventional manner. These circuits include cache, power supplies, clock circuits, input/output circuitry and subsystems, and the like. Inventive methods as described herein, such as the method 200, may be stored in the memory 264 as software routine that may be executed or invoked to control the operation of the PVD processing system 100 in the manner described herein. The software routine may also be stored and/or executed by a second CPU (not shown) that is remotely located from the hardware being controlled by the CPU 118.

In some embodiments, the present disclosure relates to a computer readable medium that when executed causes PVD processing system 100 to perform a method of passivating oxygen vacancy formation within amorphous indium gallium zinc oxide, including: depositing an amorphous indium gallium zinc oxide layer atop a gate dielectric layer; and physical vapor deposition (PVD) depositing an amorphous silicon layer atop the indium gallium zinc oxide (IGZO) material to a thickness sufficient to reduce or eliminate hydrogen contact with the indium gallium zinc oxide (IGZO) material to reduce or eliminate the formation of oxygen vacancies.

Figure 5:
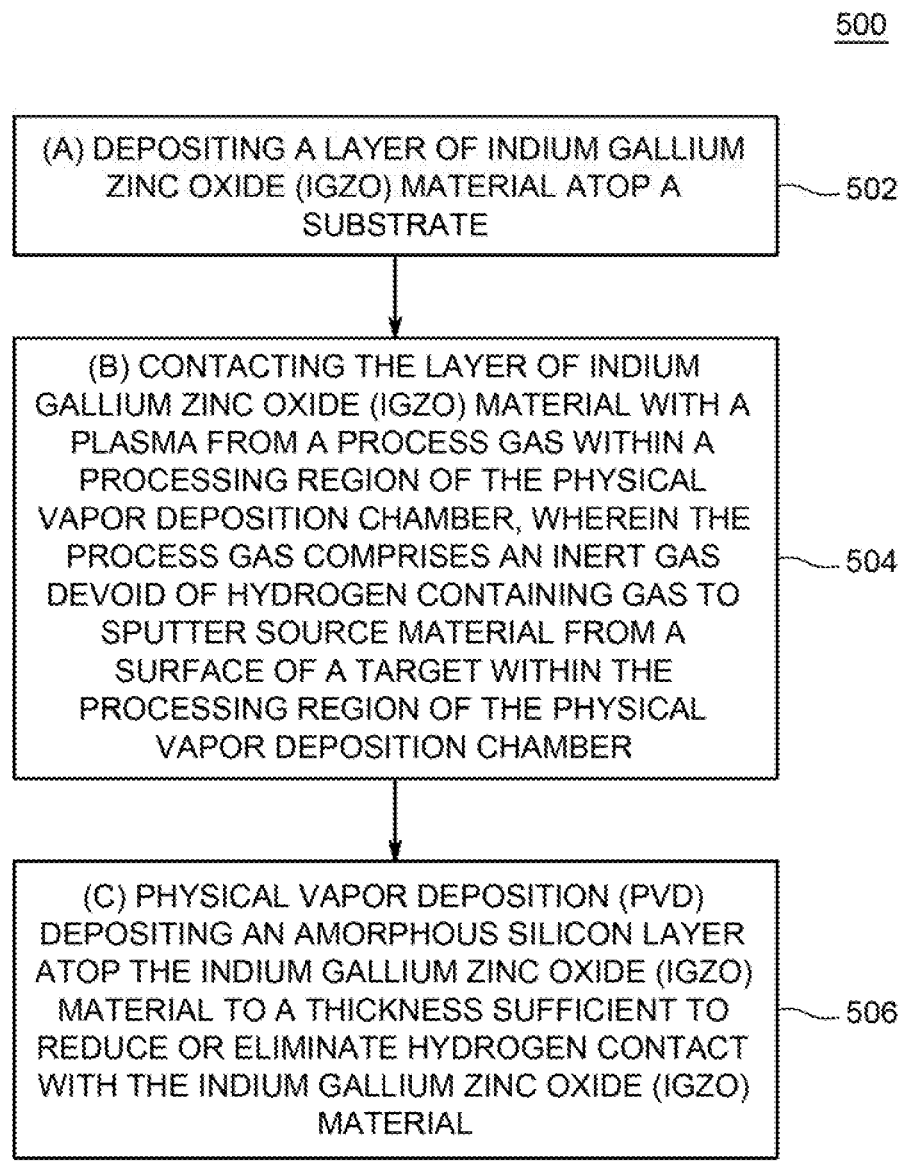
FIG. 5 depicts a flowchart of a method of processing a substrate in accordance with some embodiments of the present disclosure.

Referring now to FIG. 5, a method of processing a substrate disposed atop a substrate support in a physical vapor deposition chamber is shown as method 500. In embodiments, method 500 includes at 502 (*a*) depositing a layer of indium gallium zinc oxide (IGZO) material atop a substrate. In embodiments, method 500 includes at 504 includes (b) contacting the layer of indium gallium zinc oxide (IGZO) material with a plasma from a process gas within a processing region of the physical vapor deposition chamber, wherein the process gas comprises an inert gas devoid of hydrogen containing gas to sputter source material from a surface of a target within the processing region of the physical vapor deposition chamber. In embodiments, method 500 includes at 506 (*c*) physical vapor deposition (PVD) depositing an amorphous silicon layer atop the indium gallium zinc oxide (IGZO) material to a thickness sufficient to reduce or eliminate hydrogen contact with the indium gallium zinc oxide (IGZO) material. In some embodiments, (a), (b) and (c) are performed in sequential order, while remaining under vacuum for the duration of each process sequence. In some embodiments, (b) contacting and (c) physical vapor deposition (PVD) depositing are performed under vacuum. In some embodiments, the inert gas is provided at a flow rate of about 50 to about 1000 sccm. In some embodiments, the process gas is devoid of hydrogen ($H_2$) gas, ammonia ($NH_3$), or an alkane having a formula $C_nH_{2n+2}$. In some embodiments, a pressure in the processing region of the physical vapor deposition chamber during deposition of the amorphous silicon layer is about 3 to about 10 millitorr. In some embodiments, a temperature in the processing region of the physical vapor deposition chamber during deposition of the amorphous silicon layer is about 25 to about 400 degrees Celsius. In some embodiments, forming a plasma from a process gas further comprises applying a source power from a power source to the physical vapor deposition chamber to ignite the process gas. In some embodiments, the power source provides pulsed DC power at a pulse frequency of about 100 to about 250 kHz and at a duty cycle of about 10% to about 40%.

In some embodiments. PVD amorphous silicon (Si) capping is performed on metal oxide semiconductor for top gate thin film transistor to capture hydrogen and minimize hydrogen diffusion into metal oxide semiconductor by utilizing Si dangling bond. In embodiments, adding a PVD a-Si layer between a metal oxide semiconductor and gate insulator is performed. In some embodiments, PVD a-Si on metal oxide forms a heterojunction with metal oxide semiconductor.

While the foregoing is directed to embodiments of the present disclosure, other and further embodiments of the disclosure may be devised without departing from the basic scope thereof.

The invention claimed is:

1. A method of processing a substrate disposed atop a substrate support in a physical vapor deposition process chamber comprising:
   (a) forming a plasma from a process gas within a processing region of the physical vapor deposition process chamber, wherein the process gas comprises an inert gas to sputter silicon from a surface of a target within the processing region of the physical vapor deposition process chamber; and
   (b) depositing an amorphous silicon layer atop a first layer on the substrate, wherein the first layer comprises one or more metal oxides of indium (In), gallium (Ga), zinc (Zn), tin (Sn), or combinations thereof.

2. The method of claim 1, wherein the one or more metal oxides comprises indium gallium zinc oxide (IGZO) material.

3. The method of claim 1, wherein the inert gas comprises argon, neon, krypton, xenon or combinations thereof.

4. The method of claim 1, wherein the process gas is devoid of hydrogen containing gas.

5. The method of claim 1, wherein the process gas consists essentially of the inert gas.

6. The method of claim 1, wherein the inert gas is provided at a flow rate of about 50 to about 1000 sccm.

7. The method of claim 1, wherein the process gas is devoid of hydrogen ($H_2$) gas, ammonia ($NH_3$), or an alkane having a formula $C_nH_{2n+2}$.

8. The method of claim 1, wherein a pressure in the processing region of the physical vapor deposition chamber during deposition of the amorphous silicon layer is about 3 to about 10 millitorr.

9. The method of claim 1, wherein a temperature in the processing region of the physical vapor deposition chamber during deposition of the amorphous silicon layer is about 25 to about 400 degrees Celsius.

10. The method of claim 1, wherein forming a plasma from a process gas further comprises applying a source power from a power source to the physical vapor deposition chamber to ignite the process gas.

11. The method of claim 10, wherein the power source provides pulsed DC power at a pulse frequency of about 100 to about 250 kHz and at a duty cycle of about 10% to about 40%.

12. The method of claim 1, wherein a thickness of the amorphous silicon layer is 15 nanometers or less than 15 nanometers.

13. A substrate having an amorphous silicon layer disposed atop a first layer comprising one or more metal oxides of indium (In), gallium (Ga), zinc (Zn), tin (Sn), or combinations thereof, formed by the method of claim 1.

14. A method of processing a substrate disposed atop a substrate support in a physical vapor deposition chamber, comprising:
   (a) depositing a layer of indium gallium zinc oxide (IGZO) material atop a substrate;
   (b) contacting the layer of indium gallium zinc oxide (IGZO) material with a plasma from a process gas within a processing region of the physical vapor deposition chamber, wherein the process gas comprises an inert gas devoid of hydrogen containing gas to sputter source material from a surface of a target within the processing region of the physical vapor deposition chamber; and
   (c) depositing, via physical vapor deposition (PVD), an amorphous silicon layer atop the layer of indium gallium zinc oxide (IGZO) material to a thickness sufficient to reduce or eliminate hydrogen contact with the indium gallium zinc oxide (IGZO) material.

15. The method of claim 14, wherein (b) contacting and (c) physical vapor deposition (PVD) depositing are performed under vacuum.

16. The method of claim 14, wherein the process gas is devoid of hydrogen ($H_2$) gas, ammonia ($NH_3$), or an alkane having a formula $C_nH_{2n+2}$.

17. The method of claim 14, wherein a pressure in the processing region of the physical vapor deposition chamber during deposition of the amorphous silicon layer is about 3 to about 10 millitorr.

18. The method of claim 14, wherein a temperature in the processing region of the physical vapor deposition chamber during deposition of the amorphous silicon layer is about 25 to about 400 degrees Celsius.

19. The method of claim 14, wherein forming a plasma from a process gas further comprises applying a source power from a power source to the physical vapor deposition chamber to ignite the process gas.

20. The method of claim 19, wherein the power source provides pulsed DC power at a pulse frequency of about 100 to about 250 kHz and at a duty cycle of about 10% to about 40%.

21. A substrate having a layer of indium gallium zinc oxide (IGZO) material and an amorphous silicon layer disposed atop the layer of indium gallium zinc oxide (IGZO) material, formed by the method of claim 14.

22. A method of passivating oxygen vacancy formation within amorphous indium gallium zinc oxide, comprising:
   depositing an amorphous indium gallium zinc oxide layer atop a gate dielectric layer; and
   depositing, via physical vapor deposition (PVD), an amorphous silicon layer atop the indium gallium zinc oxide (IGZO) material to a thickness sufficient to reduce or eliminate hydrogen contact with the indium gallium zinc oxide (IGZO) material to reduce or eliminate formation of oxygen vacancies.

23. A substrate having an amorphous indium gallium zinc oxide (IGZO) layer disposed atop a gate dielectric layer and an amorphous silicon layer disposed atop the IGZO layer, formed by the method of claim 22.

* * * * *